(12) United States Patent
Vannorsdel (10) Patent No.: US 6,424,173 B1
(45) Date of Patent: Jul. 23, 2002

(54) VOLTAGE TRANSLATORS WITH ZERO STATIC POWER AND PREDICTABLE PERFORMANCE

(75) Inventor: Kevin R. Vannorsdel, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/599,058

(22) Filed: Jun. 21, 2000

(51) Int. Cl.[7] .................. H03K 19/094; H03K 19/0175
(52) U.S. Cl. .............................. 326/68; 326/74; 326/63
(58) Field of Search .............................. 326/68, 73, 74, 326/63, 70, 71

(56) References Cited

U.S. PATENT DOCUMENTS

| | | | |
|---|---|---|---|
| 4,321,491 A | | 3/1982 | Atherton et al. ............ 307/475 |
| 4,625,129 A | | 11/1986 | Ueno ........................ 307/446 |
| 5,087,841 A | * | 2/1992 | Rogers ........................ 326/65 |
| 5,276,362 A | * | 1/1994 | Obregon et al. ............... 326/65 |
| 5,420,527 A | | 5/1995 | Naber ......................... 326/32 |
| 5,506,535 A | | 4/1996 | Ratner ........................ 327/333 |
| 5,818,278 A | | 10/1998 | Yamamoto et al. ......... 327/333 |

\* cited by examiner

Primary Examiner—Michael Tokar
Assistant Examiner—Daniel D. Chang
(74) Attorney, Agent, or Firm—Lumen Intellectual Property Services (57) ABSTRACT

This invention provide a novel class of voltage translators that translate a set of input logic levels (e.g., Low=0 V and High=5 V) to a set of output logic levels (e.g., Low=−4 V and High=0 V), and vice versa, and consume no static power. In contrast to the prior art voltage translators, the output levels provided by the voltage translators of the present invention are stable and predictable, undisturbed by the state of power supply in the systems. The voltage translators of the present invention are simple in design, yet reliable and versatile in performance. They can be easily adapted to a variety of applications.

28 Claims, 5 Drawing Sheets

VOLTAGE TRANSLATORS WITH ZERO STATIC POWER AND PREDICTABLE PERFORMANCE

FIELD OF THE INVENTION

This invention relates generally to logic circuits and voltage translators. More particularly, it relates to a novel class of logic translators that consume zero static power and provides predictable performance.

BACKGROUND ART

Differential Arm Electronics IC (AE) designed for disk drives require a number of novel circuits due to the pre-amp architecture chosen and the voltage limitations imposed by the silicon technology. For instance, an AE chip is required to have its integrated circuit (IC) substrate connected to the most negative voltage present on the chip, which is typically −4 V. The silicon technology further dictates that the terminal voltage not exceed 5 V between any two terminals (amongst Source, Drain, Gate, and Body) of a field-effect-transistor (FET) fabricated on the chip. Hence, voltage translators are incorporated in AE to mitigate the above limitations.

Although various voltage translators are used in the art for shifting logic levels and other applications, as exemplified by U.S. Pat. Nos. 5,818,278, 5,506,535, 5,420,527, 4,625,129, and 4,321,491, these prior art voltage translators either do not shift an input logic level below ground to a negative output level, or consume non-zero static power. Another drawback of the prior art devices is that the output level often becomes unstable and ill-defined when the on-chip power supply is transitionally invalid (e.g., when it is initially turned on/off).

What is needed in the art, therefore, are voltage translators that can shift down or up an input logic level, while consuming zero static power and providing predictable performance.

OBJECTS AND ADVANTAGES

Accordingly it is a principal object of the present invention to provide a novel class of voltage translators that translate a set of input logic levels (e.g., Low=0 V and High=5 V) to another set of output logic levels (e.g., Low=−4 V and High=0 V), and vice versa, and consume no static power. It is another object of the present invention to provide voltage translators that operate reliably and predictably.

A notable feature of the voltage translators of the present invention is that they are simple in design, yet versatile and reliable in performance. Another important advantage of the voltage translators of the present invention is that they are composed of all CMOS devices (i.e., no bipolar transistors, no resistors, etc., are used), and consume no static power. Moreover, the voltage translators of the present invention can be easily adapted to a variety of applications.

These and other objects and advantages will become apparent from the following description and accompanying drawings.

SUMMARY OF THE INVENTION

This invention presents a voltage translator, including an input stage and a translation stage, all made of CMOS-devices. The input stage receives an input logic level and generates first and second complementary levels. The complementary levels are then fed to the translation stage, which generates an output logic level that is either shifted up, or shifted down, with respect to the input logic level.

The input stage can be as simple as an inverter, preferably a CMOS inverter. In this case, the original input logic level provides the first complementary level, while the output of the inverter, which is inverted with respect to the input logic level, is used as the second complementary level. There may be any number of additional inverters cascaded to follow the first inverter, acting as a buffer to provide an isolation between the input and translation stages.

The translation stage includes a plurality of CMOS p-channel field-effect-transistor (PFET) and n-channel field-effect-transistor (NFET), coupled to a latch. The translation stage receives the first and second complimentary levels from the input stage and generates an output logic level, which is shifted either up or down with respect to the input logic level. The translation stage may further include a pre-set stage. The presence of the latch enables the circuit to hold the output level at a predetermined value when the power supply is transitionally invalid (e.g., when the circuit is shutting off). The function of the pre-set stage is to initialize the latch when the circuit is turned on.

The voltage translators of the present invention can translate a set of input logic levels (0, 5 V) to a set of output logic levels (−4 V, 0), and vice versa. They are designed such that no static power is consumed. Furthermore, the latch action employed in these voltage translators makes the output level predictable and stable, even as the power supply decays during power-off.

The novel features of this invention, as well as the invention itself, will be best understood from the following drawings and detailed description.

DETAILED DESCRIPTION

Although the following detailed description contains many specific details for the purposes of illustration, anyone of ordinary skill in the art will appreciate that many variations and alterations to the following details are within the scope of the invention. Accordingly, the exemplary embodiment of the invention described below is set forth without any loss of generality to, and without imposing limitations upon, the claimed invention.

Figure 1:
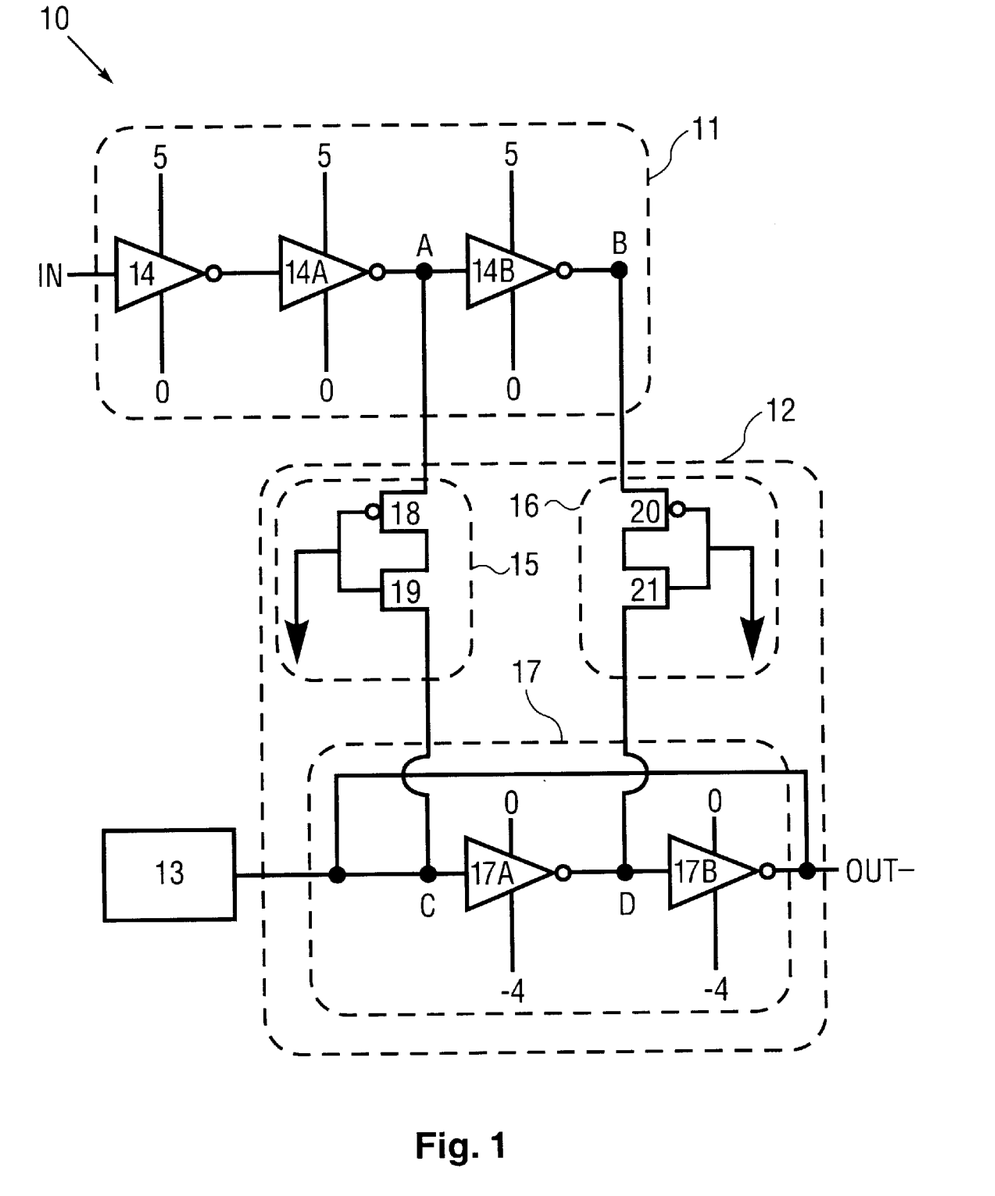
FIG. 1 shows a block diagram of a voltage translator for shifting down input levels, according to the present invention.

FIG. 1 provides a block diagram of a voltage translator for shifting down input logic levels according to the present invention. The voltage translator 10 can be broken down into three stages: an input stage 11, a translation stage 12, and a pre-set stage 13, each outlined by a dashed box.

The input stage 11 includes three inverters 14, 14A, 14B coupled in series. Each inverter is connected to 5 V and 0 V.

The function of the input stage 11 is to generate two complimentary levels of an input level IN at points A and B. Inverters 14A and 14B are employed primarily to provide a buffer, isolating the input stage from the translation stage. In the applications where such an isolation is deemed not essential, only one inverter, e.g., inverter 14, can be used for the purpose of generating the complimentary levels. In such a case, the input and output terminals of inverter 14 are connected to points A and B, respectively.

The translation stage 12 is designed to have a first branch 15 and a second branch 16, which receive the two complementary levels at points A and B respectively and are in turn connected to a latch 17. The first branch 15 includes a PFET 18 coupled in series with an NFET 19, where the drain of PFET 18 is connected to the drain of NFET 19 and the gates of these two FETs are connected to a ground. The source of the PFET 18 receives the first complementary level at point A, and the source of NFET 19 is connected to point C of the latch 17. Similarly, the second branch 16 includes a PFET 20 coupled in series an NFET 21, where the drain of PFET 20 is connected to the drain of NFET 21 and the gates of these two FETs are connected to the ground. The source of PFET 20 receives the second complementary level at point B, and the source of NFET 21 is connected to point D of latch 17. Latch 17 consists of an inverter 17A followed by another inverter 17B, where the output of inverter 17B is also fed back to the input of inverter 17A. Each inverter is further connected to 0 V and −4 V. There may be two (or more) additional inverters, such as inverters 22 and 23, (shown in FIG. 2, not shown in FIG. 1) following latch 17, to provide a buffer between the translation stage and an external device which receives an output level OUT−.

The operation of the voltage translator in FIG. 1 is as follows. Suppose that initially OUT− is pre-set to be 0 V (and correspondingly the voltages at points C and D of latch 17 are 0 V and −4 V, respectively), and IN is a high logic level, 5 V. Through the action of inverters 14, 14A, 14B, the complimentary levels at points A and B are 5 V and 0 V, respectively. Consequently, in the first branch 15 PFET 18 is turned on, however NFET 19 is off, thus no current is allowed to flow through this branch. In the second branch 16 PFET 20 is turned off, even though NFET 21 is turned on, hence no current is allowed to flow through this branch either. The voltages at points C and D of the latch 17 remain being 0 V and −4 V, respectively. OUT− stays at 0 V. Let IN now switches to a low logic level, 0 V. Through the action of inverters 14, 14A, 14B, the complimentary levels at points A and B become 0 V and 5 V, respectively. Consequently, in the first branch 15 both PFET 18 and NFET 19 are turned off, thus no current flows through this branch. In the second branch 16 both PFET 20 and NFET 21 are now turned on, hence a current flows through this branch to the latch 17. The flow of current is such that latch 17 is forced to change its state of operation and eventually driven to a state where the voltages at points C and D are −4 V and 0 V, respectively. This in turn causes NFET 21 to turn off, thus shutting off the current flow. In the final static state, PFET 18 is off though NFET 19 is on; and PFET 20 is on however NFET 21 is off. The output level OUT− is −4 V. Note that OUT− has been shifted down to a negative voltage with respect to IN. If IN then switches back to 5 V, the complimentary levels at points A and B become 5 V and 0 V again. Both PFET 18 and NFET 19 are now on in the first branch 15, and both PFET 20 and NET 21 are off in the second branch 16. A current then flows down through the first branch 15 to latch 17, driving the latch to a state where the voltages at points C and D to become 0 V and −4 V, respectively. Consequently, NFET 19 is turned off, terminating the current flow. In the final static state, PFET 18 remains being on however NFET 19 is off in the first branch 15; and PFET 20 is off though NFET 21 is on in the second branch 16. And OUT− returns to 0 V.

The voltage translator may also begin with an initial state of OUT− being pre-set to −4 V and IN being a low logic level of 0 V. Those skilled in the art will recognize that its subsequent operation simply mirrors what is described above.

Thus, the design of the voltage translator in FIG. 1 is such that it translates a set of input logic levels (High=5 V, Low=0 V) to a set of output logic levels (High=0 V, Low=−4 V).

The pre-set stage 13 in FIG. 1 is designed to initialize the system to a predetermined state when the power supply providing Veed is first turned on and before the circuits connected to Vccd are powered up and able to control the latch based upon the input level IN.

Figure 2:
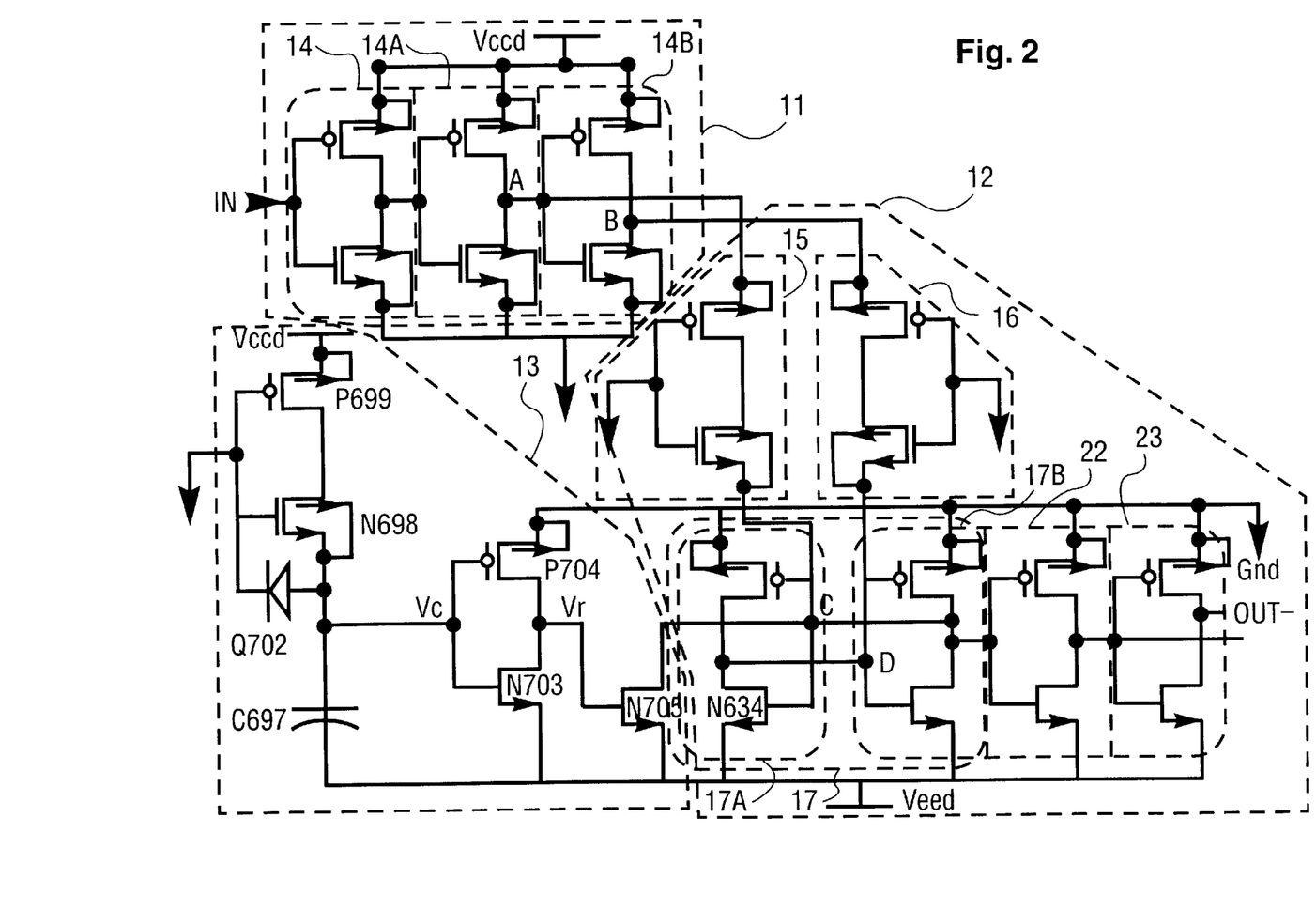
FIG. 2 depicts an exemplary circuit diagram of a voltage translator for shifting down input levels, according to the present invention.

FIG. 2 shows an exemplary circuit diagram of a voltage translator for shifting down input levels in accordance with the block diagram shown in FIG. 1. The corresponding input stage 11, translation stage 12, and pre-set stage 13 are outlined as shown. Each of inverters 14, 14A, 14B consists of a PFET coupled in series with an isolated NFETi, where the source of PFET is connected to Vccd=5 V and the source of NFETi is connected to a ground. The use of NFETi is preferable in each of these inverters, for its body can be placed at a potential above that of the underlying IC substrate. Each of first and second branches 15, 16 in the translation stage 12 includes a PFET coupled in series with an isolated NFETi.

Each of inverters 17A, 17B in latch 17 consists of a PFET and an NFET, where the source of PFET is connected to the ground and the source of NFET is connected to Veed=−4 V. There are two additional inverters 22 and 23, each configured in the same way as inverter 17A or 17B, cascaded to latch 17. The primary purpose of inverters 22 and 23 is to provide a buffer between the translation stage and an external device receiving OUT−. A detailed circuit diagram for the pre-set stage 13 is also shown. It is designed to initialize the system to a predetermined state when the power supply providing −4 V is first turned on and before the circuitry connected to Vccd is powered up and able to control the latch based upon the input level IN.

The principal operation of the pre-set stage 13 is as follows. Suppose that initially both Vccd and Veed are at 0 V. Hence the translator is non-functional and the circuit is off. As the power supply providing Veed is turned on and Veed ramps towards −4 V, while Vccd remains being 0 V, PFET P699 remains off and consequently the voltage at node 'vc' follows Veed. Since PFET P704 and NFET N698 invert this voltage, NFET N705 is turned on, causing the latch to be in an initial state where OUT− is at 0 V. As Vccd now rises towards 5 V and its associated circuitry becomes functional, P699 eventually turns on, permitting a current to flow into capacitor C697. The voltage at 'vc' subsequently increases towards the ground. Once the inverter threshold is reached, the voltage at node 'vr' is driven to Veed and NFET N705 is then turned off, which effectively cuts off the influence of the pre-set stage. From this point on, the latch state will be controlled by the operation of the translation stage. Note that Diode Q702 is added to help reset capacitor C697 when −4 V is removed.

Figure 3:
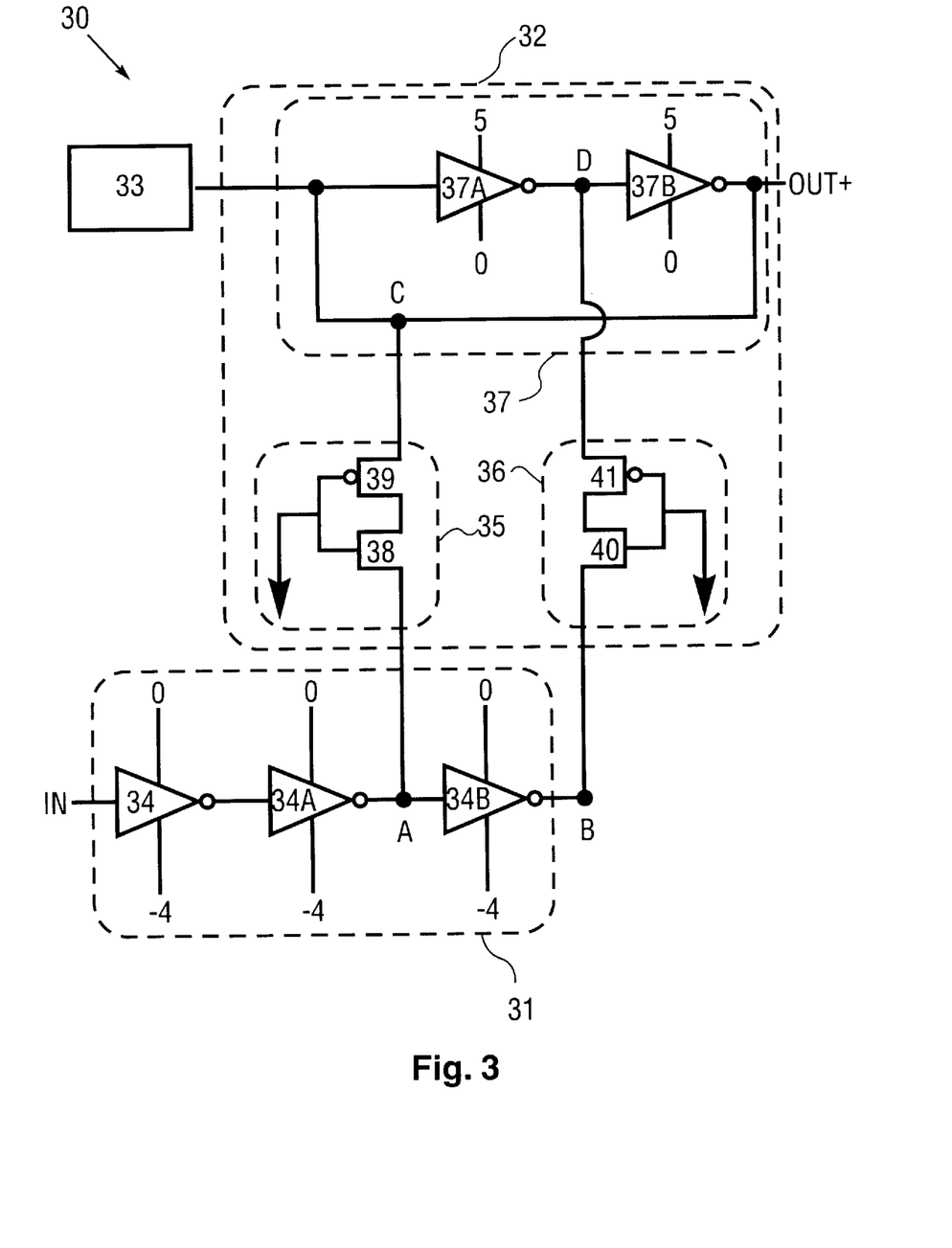
FIG. 3 shows a block diagram of a voltage translator for shifting up input levels, according to the present invention.

FIG. 3 provides a block diagram of a voltage translator for shifting up input levels according to the present invention. The voltage translator 30 can be broken down into two stages: an input stage 31, a translation stage 32, and pre-set stage 33, each outlined by a dashed box.

The input stage 31 includes three inverters 34, 34A, 34B coupled in series. Each inverter is connected to 0 V and −4 V. The function of the input stage 31 is to generate two complimentary levels of an input level IN at points A and B. Inverters 34A and 34B are implemented primarily to serve as a buffer, isolating the input stage from the translation stage. In the applications where such an isolation is deemed not essential, only one inverter, e.g., inverter 34, can be used for the purpose of generating the complimentary levels. In such a case, the input and output terminals of inverter 34 are connected to points A and B, respectively.

The translation stage 32 includes a first branch 35 and a second branch 36, which receive the two complementary levels at points A and B respectively and are in turn connected to a latch 37. The first branch 35 includes an NFET 38 coupled in series with a PFET 39, where the drain of the NFET 38 is connected to the drain of the PFET 39 and the gates of these two FETs are connected to a ground. The source of the NFET 38 receives the first complementary level at point A, and the source of PFET 39 is connected to point C of latch 37. Similarly, the second branch 36 includes an NFET 40 coupled in series with a PFET 41, where the drain of NFET 41 and the gates of these two FETs are connected to the ground. The source of NFET 40 receives the second complementary level at point B, and the source of PFET 41 is connected to point D of latch 37. The latch 37 generally comprises an inverter 37A followed by another inverter 37B, where the output of inverter 37B is fed back to the input of inverter 37A. Each inverter is further connected to 5 V and 0 V. The output level OUT+ is given by the output of inverter 37B. There may be two (or more) additional inverters, such as inverters 42 and 43, (shown in FIG. 4, not shown in FIG. 3) following latch 37, to provide a buffer between the translation stage and an external device receiving the output level OUT+.

The operation of the voltage translator in FIG. 3 is as follows. Suppose that initially OUT+ is pre-set to be 0 V (and correspondingly the voltages at points C and D are 0 V and 5 V, respectively), and IN is a low logic level, −4 V. Through the action of inverters 34, 34A, 34B, the complimentary levels at points A and B are −4 V and 0 V, respectively. Consequently, in the first branch 35 NFET 38 is turned on, however PFET 39 is off; thus no current is allowed to flow through this branch. In the second branch 36 NFET 40 is turned off, even though PFET 41 is on; hence no current is allowed to flow through this branch, either. The voltages at points C and D of the latch 17 remain being 0 V and 5 V, respectively. OUT+ stays at 0 V. Let IN now switches to a high logic level, 0 V. Through the action of inverters 34, 34A, 34B, the complimentary levels at points A and B become 0 V and −4 V, respectively. Consequently, in the first branch 35 both NFET 38 and PFET 39 are turned off, thus no current flows through this branch. In the second branch 36 both NFET 40 and PFET 41 are now turned on, hence a current flowing through the branch 36 to the latch 37. This flow of current forces the latch 37 to change its state of operation and eventually drives the latch 37 to a state where the voltages at points C and D are 5 V and 0 V, respectively. This causes PFET 41 to turn off, thus shutting off the current flow. In the final static state, NFET 38 is off though PFET 39 is on; and NFET 40 is on however PFET 41 is off. OUT+ changes to 5 V. Note that OUT+ has been shifted up to a positive level with respect to IN. If IN then switches back to −4 V, the complimentary levels at points A and B become −4 V and 0 V again. Both NFET 38 and PFET 39 are now on in the first branch 35, and both NFET 40 and PFET 41 are off in the second branch 36. A current then flows through the branch 35 to the latch 37, driving the latch to a state where the voltages at points C and D become 0 V and 5 V, respectively. Consequently, PFET 39 is turned off, terminating the flow of current. In the final static state, NFET 38 remains on however PFET 39 is off in the first branch 35; and NFET 40 is off though PFET 41 is on in the second branch 36. And OUT+ returns to 0 V.

The voltage translator in FIG. 3 may also begin with an initial state in which OUT− is pre-set to be 5 V and IN is a high logic level of 0 V. Those skilled in the art will recognize that the subsequent operation of this circuit simply mirrors what is described above.

Hence, the design of the voltage translator in FIG. 3 is such that it translates a set of input logic levels (High=0 V, Low=−4 V) to a set of output logic levels (High=5 V, Low=0 V).

The pre-set stage 33 in FIG. 3 is designed to initialize the system to a predetermined state when the power supply providing Vccd is first turned on, and before the circuitry connected to Veed is powered up and able to control the latch based upon the input level IN. It also holds OUT+ at its present level if the power supply decays to a sufficiently low value.

Figure 4:
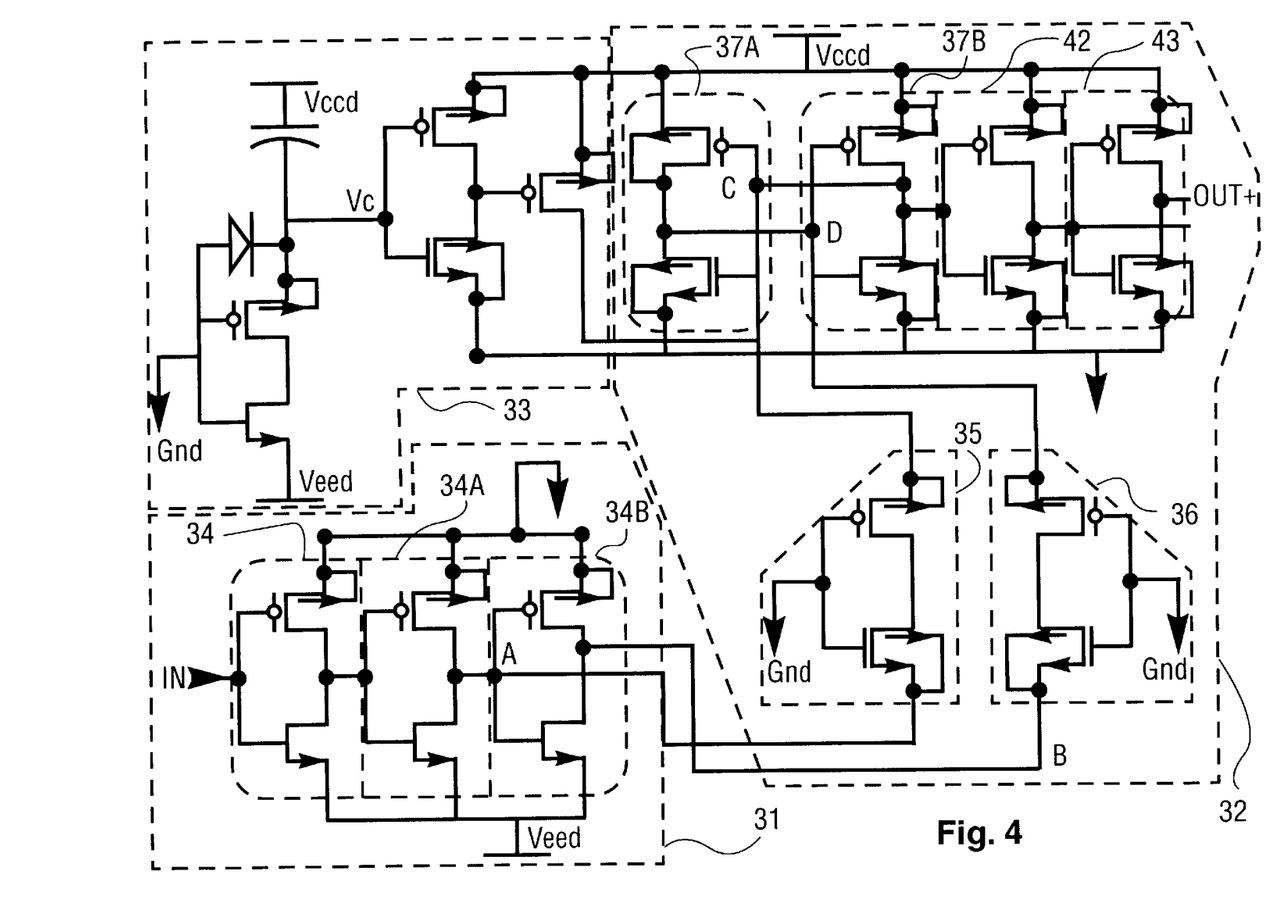
FIG. 4 depicts an exemplary circuit diagram of a voltage translator for shifting up input levels, according to the present invention.

FIG. 4 shows an exemplary circuit diagram of a voltage translator for shifting up input levels in accordance with the block diagram shown in FIG. 3. The corresponding input stage 31, translation stage 32, and pre-set stage 33 are outlined as shown. Each of inverters 34, 34A, 34B consists of a PFET coupled in series with an NFET, where the source of NFET is connected to Veed=−4 V and the source of PFET is connected to a ground. Each of first and second branches 35, 36 in the translation stage 32 includes an isolated NFETi coupled in series with a PFET. The use of NFETi is preferable for it is able to withstand higher voltages applied to its terminals. Each of the inverters 37A and 37B in the latch 37 consists of an isolated NFETi and a PFET, where the source of NFETi is connected to the ground while the source of PFET is connected to Vccd=5 V. There are two additional inverters 42 and 43, each configured in the same way as inverters 37A and 37B, cascaded to latch 37. The function of these two inverters is to provide a buffer between the translation stage and an external device receiving OUT+. A detailed circuit diagram for the pre-set stage 33 is also shown. It is designed to initialize the system to a predetermined state when the power supply providing Vccd is first turned on and before the circuitry connected to Veed is powered up and able to control the latch based upon the input level IN. The operation of the pre-set stage 33 mirrors its counterpart, the pre-set stage 13, in FIG. 2.

An important advantage of the voltage translators of the present invention is that they employ all CMOS devices, and consume no static power. Moreover, the use of the pre-set stage and the latch in the translation stage makes the output level to be stable and predictable, undisturbed by the state of the power supply.

Figure 5:
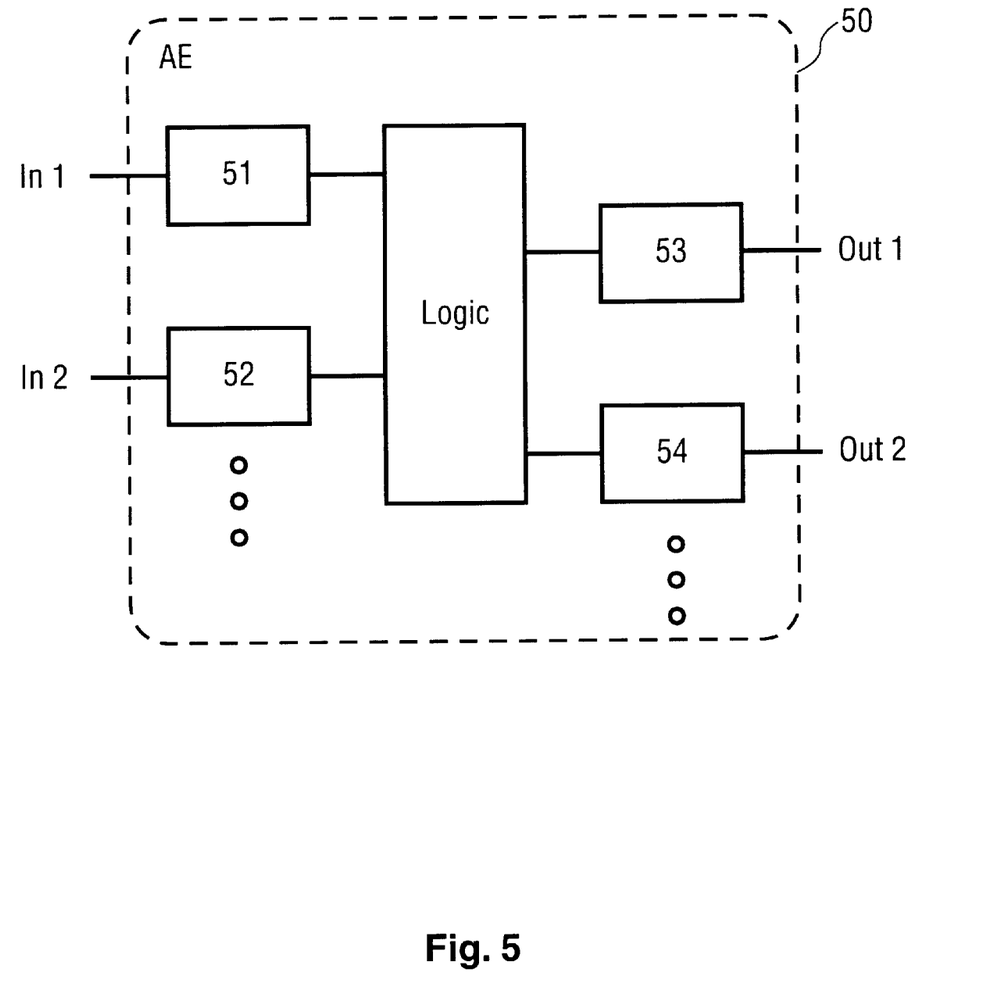
FIG. 5 shows an exemplary application of the voltage translators of the present invention in AE.

FIG. 5 provides an exemplary embodiment illustrating an application of the voltage translators of the present invention in an AE device 50. A plurality of down-shifting voltage translators, such as down-shifting translators 51, 52, are incorporated in AE 50 to translate a series of conventional logic levels (0 V, 5 V) from input to a corresponding series of logic levels (−4 V, 0 V). These down-shifted logic levels are more desirable for various components on the AE chip, given the constrains imposed by the silicon technology as discussed earlier. AE 50 also employs a plurality of up-shifting voltage translators, such as up-shifting translators 53, 54, to restore the logic levels to the conventional values, so to be coupled to other devices.

Those skilled in the art will also recognize that the voltage translators of the present invention can be employed in many other applications, where the conventional logic levels need to be shifted up or down. A skilled artisan can implement the voltage translators of the present inventions in ways suitable for a given application.

Although the present invention and its advantages have been described in detail, it should be understood that various changes, substitutions, and alternations can be made herein without departing from the principle and the scope of the invention. Accordingly, the scope of the present invention should be determined by the following claims and their legal equivalents.

What is claimed is:

1. A voltage translator comprising:
   a) a CMOS input stage, the input stage being connected between Vccd and 0 volts, wherein said input stage receives an input level and generates first and second complementary levels; and
   b) a translation stage comprising a CMOS latch, the latch being connected between 0 volts and Veed, wherein said translation stage receives said first and second complementary levels and the latch produces an output level, wherein the input level belongs to the set consisting of Vccd and 0 volts and the output level belongs to the set consisting of Veed and 0 volts, wherein Vccd is positive and Veed is negative.

2. The voltage translator of claim 1 wherein said input stage comprises a first CMOS inverter, the first inverter having an input and an output, wherein said first complementary level is applied to the input of the first inverter and the second complementary level appears at the output of said first inverter.

3. The voltage translator of claim 2 wherein said input stage further comprises second and third CMOS inverters, the second inverter having an input and an output, and the third inverter having an input and an output, wherein the input of the third inverter receives the input level, the output of the third inverter is connected to the input of the second inverter, and the output of the second inverter is connected to the input of the first inverter.

4. The voltage translator of claim 2 wherein said latch comprises a fourth CMOS inverter and a fifth CMOS inverter, the fourth inverter having an input and an output, the fifth inverter having an input and an output, the output of the fourth inverter being connected to the input of the fifth inverter and the output of the fifth inverter being connected to the input of the fourth inverter, and wherein the translation stage further comprises:
   a first branch comprising a first PFET and a first NFET, the first PFET being connected between the input of the first inverter and the first NFET, and the first NFET being connected between the first PFET and the input of the fourth inverter, the first PFET comprising a first gate, the first gate being connected to ground, the first NFET comprising a second gate, the second gate being connected to ground; and
   a second branch comprising a second PFET and a second NFET, the second PFET being connected between the output of the first inverter and the second NFET and the second NFET being connected between the PFET and the input of the fifth inverter, the second PFET having a third gate, the third gate being connected to ground, the second NFET having a fourth gate, the fourth gate being connected to ground.

5. The voltage translator of claim 4 wherein said latch is further coupled to sixth and seventh inverters, wherein said sixth and seventh inverters are cascaded in series and serve as a buffer.

6. The voltage translator of claim 4 wherein, when the first complementary level goes from 0 volts to Vccd, the first branch conducts briefly and makes the output level go from Veed to 0 volts, and wherein when the second complementary level goes from 0 volts to Vccd the second branch conducts briefly and makes the output level go from 0 volts to Veed.

7. The voltage translator of claim 1 further comprising a pre-set stage coupled to said translation stage, wherein said pre-set stage initializes said voltage translator such that said output level is at a predetermined level.

8. The voltage translator of claim 1 wherein Vccd is +5 volts and Veed is −4 volts.

9. A method for shifting logic levels down using a CMOS circuit, the method comprising:
   a) inputting an input logic level to a CMOS input stage, wherein the input stage operates between Vccd and 0 volts;
   b) generating, in the input stage, first and second complementary levels of the input logic level; and
   c) feeding said first and second complementary levels to a translation stage wherein said first and second complementary levels are applied through first and second branches respectively to a CMOS latch, wherein the latch operates between 0 volts and Veed;
   wherein, when the first complementary level goes from 0 volts to Vccd, the first branch conducts briefly so that the output logic level produced by the latch goes from Veed to 0 volts, and when the second complementary level goes from 0 volts to Vccd the second branch conducts briefly so that the output logic level produced by the latch goes from 0 volts to Veed.

10. The method of claim 9 further comprising the step of initializing the circuit so that the output logic level is at a predetermined value.

11. The method of claim 9 wherein said input stage comprises a first CMOS inverter, the first inverter having an input and an output, wherein the first complementary level is applied to the input of the first inverter and the second complementary level appears at the output of the first inverter.

12. The method of claim 11 wherein the CMOS latch comprises a second inverter having an input and an output and a third inverter having an input and an output, wherein the output of the second inverter is connected to the input of the third inverter and the output of the third inverter is connected to the input of the second inverter, and wherein the first branch comprises a first PFET and a first NFET, the first PFET being connected between the input of the first inverter and the first NFET and the first NFET being connected between the first PFET and the input of the second inverter, and wherein the second branch comprises a second PFET and a second NFET, the second PFET being connected between the output of the first inverter and the second NFET and the second NFET being connected between the second PFET and the input of the third inverter, wherein the first PFET comprises a first gate, the first NFET comprises a second gate, the second PFET comprises a third gate and the second NFET comprises a fourth gate, wherein the first, second, third and fourth gates are connected to ground.

13. The method of claim 12 further comprising the step of using said latch to maintain said output logic level when a power supply to said circuit is transitionally invalid.

14. The method of claim 9 wherein Vccd is +5 volts and Veed is −4 volts.

15. A voltage translator comprising:
   a CMOS input stage, the input stage being connected between 0 volts and Veed, wherein the input stage receives an input level and generates first and second complementary levels; and
   a translation stage comprising a CMOS latch, the latch being connected between Vccd and 0 volts, wherein the translation stage receives the first and second complementary levels and the latch produces an output level, wherein the input level belongs to the set consisting of 0 volts and Veed and the output level belongs to the set consisting of Vccd and 0 volts, wherein Vccd is positive and Veed is negative.

16. The voltage translator of claim 15 wherein the input stage comprises a first CMOS inverter, the first inverter having an input and an output, wherein the first complementary level is applied to the input of the first inverter and the second complementary level appears at the output of the first inverter.

17. The voltage translator of claim 16 wherein the input stage further comprises second and third CMOS inverters, the second inverter having an input and an output, the third inverter having an input and an output, wherein the input of the third inverter receives the input level, the output of the third inverter is connected to the input of the second inverter, the output of the second inverter is connected to the input of the first inverter.

18. The voltage translator of claim 16 wherein the latch comprises a fourth CMOS inverter and a fifth CMOS inverter, the fourth inverter having an input and an output, the fifth inverter having an input and an output, the output of the fourth inverter being connected to the input of the fifth inverter and the output of the fifth inverter being connected to the input of the fourth inverter, and wherein the translation stage further comprises:
   a first branch comprising a first PFET and a first NFET, the first PFET being connected between the input of the fourth inverter and the first NFET, and the first NFET being connected between the first PFET and the input of the first inverter, the first PFET comprising a first gate, the first gate being connected to ground, the first NFET comprising a second gate, the second gate being connected to ground; and
   a second branch comprising a second PFET and a second NFET, the second PFET being connected between the output of the fourth inverter and the second NFET, the second NFET being connected between the second PFET and the output of the first inverter, the second PFET comprising a third gate, the third gate being connected to ground, the second NFET comprising a fourth gate, the fourth gate being connected to ground.

19. The voltage translator of claim 18 wherein the translation stage further comprises sixth and seventh CMOS inverters, wherein the output of the fifth inverter is connected to the input of the sixth inverter and the output of the sixth inverter is connected to the input of the seventh inverter.

20. The voltage translator of claim 18 wherein, when the first complementary level goes from 0 volts to Vccd, the first branch conducts briefly and makes the output level go from Veed to 0 volts, and wherein when the second complementary level goes from 0 volts to Vccd the second branch conducts briefly and makes the output level goes from 0 volts to Veed.

21. The voltage translator of claim 15 further comprising a pre-set stage coupled to the translation stage, wherein the pre-set stage initializes the voltage translator such that the output level is at a predetermined level.

22. The voltage translator of claim 15 wherein Vccd is +5 volts and Veed is −4 volts.

23. A method for shifting logic voltage levels up using a CMOS circuit, the method comprising:
   inputting an input logic level to a CMOS input stage, wherein the input stage operates between 0 Volts and Veed;
   generating, in the input stage, first and second complementary levels of the input logic level; and
   feeding said first and second complementary levels to a translation stage wherein said first and second complementary levels are applied through first and second branches respectively to a CMOS latch, wherein the latch operates between Vccd and 0 volts;
   wherein, when the first complementary level goes from 0 volts to Veed, the first branch conducts briefly so that the output logic level produced by the latch goes from Vccd to 0 volts, and when the second complementary level goes from 0 volts to Veed, the second branch conducts briefly so that the output logic level produced by the latch goes from 0 volts to Vccd.

24. The method of claim 23 further comprising the step of initializing the circuit so that the output logic level is at a predetermined level.

25. The method of claim 23 wherein said input stage comprises a first CMOS inverter, the first inverter having an input and an output, wherein the first complementary level is applied to the input of the first inverter and the second complementary level appears at the output of the first inverter.

26. The method of claim 25 wherein the CMOS latch comprises a second inverter, the second inverter having an input and an output, and a third inverter, the third inverter having an input and an output, the output of the second inverter being connected to the input of the third inverter and the output of the third inverter being connected to the input of the second inverter, and wherein the first branch comprises a first PFET and a first NFET, the first PFET being connected between the input of the second inverter and the first NFET, the first NFET being connected between the PFET and the input of the first inverter, the first PFET comprising a first gate, the first gate being connected to ground, the first NFET comprising a second gate, the second gate being connected to ground, and wherein the second branch comprises a second PFET and a second NFET, the second PFET being connected between the input of the third inverter and the second NFET, the second NFET being connected between the second PFET and the output of the first inverter, the second PFET comprising a third gate, the third gate being connected to ground, the second NFET comprising a fourth gate, the fourth gate being connected to ground.

27. The method of claim 25 further comprising the step of using the latch to maintain the output logic level when a power supply to the circuit is transitionally invalid.

28. The method of claim 23 wherein Vccd is +5 volts and Veed is −4 volts.

* * * * *